United States Patent [19]

Kobayashi

[11] Patent Number: 5,514,521
[45] Date of Patent: May 7, 1996

[54] PHOTOCURABLE COMPOSITION

[75] Inventor: Naomichi Kobayashi, Nagoya, Japan

[73] Assignee: Brother Kogyo Kabushiki Kaisha, Nagoya, Japan

[21] Appl. No.: 287,585

[22] Filed: Aug. 8, 1994

Related U.S. Application Data

[63] Continuation of Ser. No. 737,980, Jul. 30, 1991, abandoned.

[30] Foreign Application Priority Data

| Aug. 22, 1990 | [JP] | Japan | 2-221967 |
| Aug. 22, 1990 | [JP] | Japan | 2-221968 |

[51] Int. Cl.$^6$ ..................... G03C 1/725
[52] U.S. Cl. ........................... 430/281.1; 522/25
[58] Field of Search .............. 430/281, 281.1; 522/25

[56] References Cited

U.S. PATENT DOCUMENTS

| Re. 28,789 | 4/1976 | Chang | 96/86 |
| 2,588,899 | 3/1952 | Voorthuis et al. | 260/45.7 |
| 2,666,701 | 1/1954 | West | 430/926 |
| 3,418,118 | 12/1968 | Thommes et al. | 96/11 |
| 3,479,185 | 11/1969 | Chambers | 96/84 |
| 3,495,987 | 2/1970 | Moore | 96/115 |
| 3,652,275 | 3/1972 | Baum et al. | 96/48 |
| 3,756,827 | 9/1973 | Chang | 96/86 |
| 4,071,424 | 1/1978 | Dart | 522/14 |
| 4,113,593 | 9/1978 | Barzinski | 522/14 |
| 4,343,885 | 8/1982 | Reardon | 522/14 |
| 4,548,891 | 10/1985 | Reidiker et al. | 430/283 |
| 4,766,055 | 8/1988 | Kawabata et al. | 430/281 |
| 4,772,530 | 9/1988 | Gottschalk | 522/25 |
| 4,777,190 | 10/1988 | Sasaki et al. | 522/17 |
| 4,857,437 | 8/1989 | Banks et al. | 430/327 |
| 4,857,654 | 8/1989 | Reidiker et al. | 430/281 |
| 4,859,572 | 8/1989 | Farid | 522/25 |
| 4,910,121 | 3/1990 | Reidiker et al. | 430/281 |
| 4,985,470 | 1/1991 | Nagasaka et al. | 522/26 |
| 5,049,479 | 9/1991 | Zertani | 522/25 |
| 5,102,775 | 4/1992 | Okuhara | 522/25 |

FOREIGN PATENT DOCUMENTS

| 0152377 | 8/1985 | European Pat. Off. . |
| 44-20189 | 8/1969 | Japan . |
| 45-37377 | 11/1970 | Japan . |
| 47-2528 | 2/1972 | Japan . |
| 48-84183 | 11/1973 | Japan . |
| 52-134692 | 11/1977 | Japan . |
| 54-151024 | 11/1979 | Japan . |
| 54-155292 | 12/1979 | Japan . |
| 57-21401 | 2/1982 | Japan . |
| 58-29803 | 2/1983 | Japan . |
| 58-19315 | 2/1983 | Japan . |
| 58-40302 | 3/1983 | Japan . |
| 59-56403 | 3/1984 | Japan . |
| 60-32801 | 2/1985 | Japan . |
| 61-258803 | 11/1986 | Japan . |
| 61-258802 | 11/1986 | Japan . |

OTHER PUBLICATIONS

Slominskii "Polymethine—" Chemical Abstracts, vol. 90, No. 16, Apr. 16 1979. Abstract #90:123038j.
Morimitsu "Electrophotographic"; Chemical Abstracts, vol. 112, No. 14, Apr. 2, 1990. Abstract #112:129117d.
Online Printout for Registry No. 102185–03–5.
Suzuki et al "Visible–Light–Sensitive—". Chemical Abstracts vol. 116, No. 4. p. 714. Abstract No. 31425k. Jan. 27 1992.
Photoinitiated Cationic Polymerization of Epoxides with Iron–Arene Complexes—Meier et al. Oct. 1986–Journal of Radiation Curing pp. 27–31.

*Primary Examiner*—Mark Chapman
*Attorney, Agent, or Firm*—Oliff & Berridge

[57] ABSTRACT

A photocurable composition comprises a radical-polymerizable unsaturated group including a mixed material which consists of polyethylene glycol di(meth)acrylate and dipentaerythritol hexa(meth)acrylate as a base material, an iron arene compound as a photopolymerization initiator, and an aniline system compound which is N,N-Dimethylaniline as a photochemical sensitizer for having a photocuring sensitivity to light having a wavelength in the range from the ultraviolet region to the infrared region. A photocurable composition comprises a radical-polymerizable unsaturated group including a mixed material which consists of polyethylene glycol di(meth)acrylate and dipentaerythritol hexa(meth)acrylate, as a base material, an iron arene compound as a photopolymerization initiator, and a cyanine system compound which is 2-[2-[2-chloro-3-[ (1,3-dihydro-1,3,3-trimethyl-2H-indole-2-ylidene)ethylidene] -1-cyclohexane-1-yl]ethenyl]-1,3,3-trimethyl-3H-indolium salt as a spectral sensitizer for having a sensitivity to light having a wavelength ranging from the visible region to a near infrared region. A photocomposition comprising the base material, the photopolymerization initiator and both the photochemical and spectral sensitizers may also be used to obtain the photocuring characteristics.

10 Claims, No Drawings

PHOTOCURABLE COMPOSITION

This is a Continuation of application Ser. No. 07/737,980 filed Jul. 30, 1991, now abandoned.

BACKGROUND OF THE INVENTION

1. Field of the Invention

The present invention relates to a photocurable composition, and more particularly, to a photocurable composition which is sensitive to light with a wavelength ranging from the ultraviolet region to the infrared region.

2. Description of the Related Art

Conventionally, image recording has been performed, for example, by irradiating light onto a photosensitive recording medium having a photocurable composition coated on the surface thereof based on image information, whereby the composition is cured only at an exposed area to record the image on the recording medium.

Various kinds of photocurable compositions used for such a medium are known. The photocurable compositions include a compound having a radical-polymerizable unsaturated group as a base material, a photopolymerization initiator, a sensitizer, and the like.

A composition of Benzil, Michler's ketone, diethylthioxanthone, benzophenone, and acetophenone is used alone as a photopolymerization initiator. There are also many composite type photopolymerization initiators, as follows:

(1) a dye/aliphatic amine composite system as described in JP-B-44-20189 (The term "JP-B" therein used means "an examined published Japanese patent publication. The Japanese patent publication of JP-B-44-20189 corresponds to U.S. Pats. Nos. 3,495,987, 3,479,185, 3,418,118 and 2,588,899);

(2) a hexaarylbiimidazole/radical-forming agent/dye composite system as described in JP-B-45-37377 (The Japanese patent publication of JP-B-45-37377 corresponds to U.S. Pats. Nos. 3,495,987, 3,479,185, 3,418,118 and 2,588,899);

(3) a hexaarylbiimidazole/p-dialkylaminobenzylidene ketone composite system as described in JP-A-47-2528 (the term "JP-A" herein used means "an unexamined Japanese patent application") (The Japanese patent publication JP-A-47-2528 corresponds to U.S. Pat. No. 3,652,275);

(4) a cyclic cis-α-dicarbonyl compound/dye composite system as described in JP-A-48-84183 (The Japanese patent publication JP-A-48-84183 corresponds to U.S. Pat. No. 3,756,827 and U.S. Pat. Re. No. 28,789);

(5) a carbonyl compound/tertiary amine composite system as described in JP-A-52-134692;

(6) a substituted triazine/merocyanine dye composite system as described in JP-A-54-151024;

(7) a biimidazole/indanone composite system as described in JP-A-54-155292;

(8) a hexaarylbiimidazole/p-dialkylaminostilbene derivative composite system as described in JP-A-57-21401;

(9) a hexaarylbiimidazole/p-alkylaminocinnamylidene derivative composite system as described in JP-A-58-19315;

(10) a triazine derivative/cyanine dye composite system as described in JP-A-58-29803;

(11) a triazine derivative/thiapyrylium salt composite system as described in JP-A-58-40302;

(12) a hexaarylbiimidazole/n-dialkylaminostilbene derivative composite system or a p-dialkylaminophenylbutadienyl derivative/thiol compound composite system as described in JP-A-59-56403 (The Japanese patent publication JP-A-59-56403 corresponds to U.S. Pat. No. 4,985,470);

(13) a ketone-substituted derivative/organic peroxide composite system as described in JP-A-60-32801;

(14) an α-diketone/mercaptocarboxylic acid composite system as described in JP-A-61-258802 (The Japanese patent publication JP-A-61-258802 corresponds to U.S. Pat. No. 4,777,190); and

(15) an α-diketone/polysulfide composite system as described in JP-A-61-258803 (The Japanese patent publication JP-A-61-258803 corresponds to U.S. Pat. No. 4,777,190).

However, the photocurable compositions comprising the above conventional photopolymerization initiators which are used alone are designed to act upon irradiation of light having a wavelength of 400 nm or shorter, which is close to the lower end of the visible region.

The photocurable composition comprising the composite type photopolymerization or the photopolymerization initiators which are used alone have various drawbacks characterized by, for example, a low sensitivity for photopolymerization and a low curing speed. Therefore, they require a long time for image recording.

SUMMARY OF THE INVENTION

It is therefore an object of the present invention to overcome the above described drawbacks and disadvantages and to provide a photocurable composition with improved photocuring sensitivity to light of an arbitrary wavelength ranging from the ultraviolet region to the infrared region and which can be cured in a short time.

A second object of the present invention is to provide a photocurable composition which is sensitive to light having a wavelength ranging from the visible region to a near infrared region.

To attain the first object, according to the invention, there is provided a photocurable composition comprising a compound having a radical-polymerizable unsaturated group as a base material, a photopolymerization initiator and an aniline system compound as photochemical sensitizer.

To attain the second object, according to the invention, there is provided a photocurable composition comprising a compound having a radical-polymerizable unsaturated group as a base material, a metal arene compound as a photopolymerization initiator and an cyanine system compound which is a spectral sensitizer of the infrared region.

DETAILED DESCRIPTION OF THE PREFERRED EMBODIMENTS

A first embodiment directed to attaining the first object will now be described.

Radical-polymerizable unsaturated groups in the present invention, are not limited to specific kinds of materials, and include N-vinyl-2-pyrrolidone, bisphenol A diacrylate or dimethacrylate (hereafter, acrylate and methacrylate being collectively referred to as "(meth)acrylate"), tripropylene glycol di(meth)acrylate, polyethylene glycol di(meth)acrylate, pentaerythritol tri(meth)acrylate, dipentaerythritol hexa(meth)acrylate, trimethylolpropane tri(meth)acrylate and oligo ester (meth)acrylate. These radical-polymerizable unsaturated groups may be used alone or as a mixture thereof.

The photocurable composition comprises the photopolymerization initiator. Benzil, Michler's ketone, diethylthioxanthone, benzophenone, acetophenone, and a metal arene compound are used as the photopolymerization initiator. The use of a metal arene compound is preferred. These photopolymerization initiators may also be used alone or as a mixture. The metal arene compound, which is the preferred material as the photopolymerization initiator, has a structure represented by formula (1):

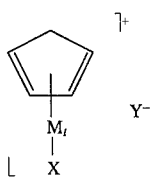   (1)

wherein $M_t$ is a metal such as Fe, and X is a group containing at least one benzene ring, for example, benzene itself is preferred. $Y^-$ is a basic ion such as $BF_4^-$, $PF_6^-$, and $AsF_6^-$.

The photocurable composition contains the metal arene compound in an amount of 0.01–20 weight % of the radical-polymerizable unsaturated group, preferred is the metal arene compound in an amount of 1–10 weight % of the radical-polymerizable unsaturated group. If the photocurable composition contains the metal arene compound in an amount greater than 20 weight % of the radicalpolymerizable unsaturated group, the metal arene compound does not dissolve in the radical-polymerizable unsaturated group. If the photocurable composition contains the metal arene compound in an amount of less than 0.01 weight % of the radical-polymerizable unsaturated group, the photocurable composition is not cured.

The photocurable composition contains an aniline system compound as a photochemical sensitizer. The aniline system compound to be used is not limited to specific materials. However, an aniline system compound which contains alkyl group is preferred.

Examples of materials that may be used as the aniline system compound include N,N-dimethylaniline; 4-cyano-N,N-dimethylaniline; 4-acetyl-N,N-dimethylalinine; 4-bromo-N,N-dimethylaniline; ethyl4-(N,N-dimethylamino) benzoate; 3-chloro-N,N-dimethylaniline; 4-chloro-N,N-dimethylaniline; 3-ethoxy-N,N-dimethylaniline; 4-fluoro-N,N-dimethylaniline; 4-methyl-N,N-dimethylaniline; 4-ethoxy-N,N-dimethylaniline; N,N-dimethylthioanisidine; 4-amino-N,N-dimethylaniline; 3-hydroxy-N,N-dimethylaniline; N,N,N',N'-tetraethyl-1, 4-dianiline; and 4-acetamide-N,N-dimethylaniline.

The photocurable composition comprises the aniline system compound which has alkyl radical in an amount of 0.01–50 weight % of the radical-polymerizable unsaturated group, more preferably the aniline system compound which has alkyl radical in an amount of 1–15 weight % of the radical-polymerizable unsaturated group. If the photocurable composition comprises the aniline system compound in an amount of more than 50 weight % of the radicalpolymerizable unsaturated group, the photocurable composition is not cured. If the photocurable composition comprises the aniline system compound in an amount of less than 0.01 weight % of the radical-polymerizable unsaturated group, curing of the photocurable composition is not promoted.

According to the photocurable composition of the present invention, when the photopolymerization initiator I is exposed to light, the excited photopolymerization initiator I is made radical as shown in scheme (3), and a radical R· is triggered. The triggered radical R· triggers additional polymerization of the compound having a radical-polymerizable unsaturated group M as shown in scheme (4). However, if Oxygen $O_2$ exists in the reaction system, radical R· reacts with oxygen to be $RO_2$· as shown in scheme (5). But $RO_2$· does not trigger additional polymerization of the compound having the radical-polymerizable unsaturated group M.

As shown in scheme (6), if the aniline system compound is added in the reaction system where oxygen exists, hydrogen H existing in aniline system compound R'H is added to $RO_2$·, so that $RO_2H$ and the radical R'· are triggered. The radical R'· enables the triggering of additional polymerization of the compound having the radical-polymerizable unsaturated compound M. Thus, the photopolymerization reaction velocity, that is, the speed for triggering addition polymerization, is not restrained by the presence of oxygen.

   (3)

   (4)

   (5)

   (6)

In the above scheme
I: photopolymerization initiator
R·: radical generated from a photopolymerization initiator
M: radical-photopolymerizable unsaturated group
$O_2$: Oxygen molecule
R'H: aniline system compound
R'·: radical generated from an aniline system compound As is apparent from above, in the photocurable composition of the invention, as the radical-polymerizable unsaturated group containing compound, the photopolymerization initiator and the aniline system compound react as described in equations (3), (4), and (6) and the photocurable composition gains a greater photocuring sensitivity. Therefore, the photocuring time is shortened and the photocuring composition can be used for wavelengths ranging from the ultraviolet region to the infrared region.

Hereinafter, the present invention will be described with reference specific examples.

Example of Experiment 1

N,N-dimethylaniline is used as an aniline system compound.

   (7)

A photocurable composition comprises a radical-polymerizable unsaturated group including a mixed material which consists of polyethylene glycol di(meth)acrylate and dipentaerythritol hexa(meth)acrylate as a base material, an iron arene compound as a photopolymerization initiator (X is benzene, Y is $PF_6^-$) and an aniline system compound, which is N,N-Dimethylaniline, as a photochemical sensitizer.

The mixing ratio is as shown in Table 1 below.

TABLE 1

| RADICAL-POLYMERIZABLE UNSATURATED GROUP | AMOUNT OF THE MIXTURE |
|---|---|
| BASE MATERIAL | |
| Polyethylene glycol di(meth)acrylate Dipentaerythritol hexa(meth)acrylate (The ratio of mixture is 3:4) | 10 g |
| PHOTOPOLYMERIZATION INITIATOR | |
| Iron arene compound | 0.1 g |
| PHOTOCHEMICAL SENSITIZER | |
| N, N-Dimethylaniline | 0.1 g |

The radical-polymerizable unsaturated group, the photopolymerization initiator and the photochemical sensitizer were mixed by adding the 10 g of a mixture of polyethylene glycol di(meth)acrylate and dipentaerythritol hexa(meth)acrylate (mixed at a ratio of 3:4) to the 0.1 g of the iron arene compound photopolymerization initiator, and 0.1 g of a mixture of N,N-dimethylaniline, the photochemical sensitizer, as shown in Table 1. The mixture was stirred at about 100° C. for about 15 minutes with supersonic irradiation. The temperature may vary between 20° (room temperature) to 200° C., but is preferably 50° C. to 150° C., for at least 10 minutes of the 15 minutes.

Example of Experiment 2

The example of experiment 2 is the same as the example of experiment 1 except for using 2,2-dimethoxy- 2-phenylacetophenone as the photochemical sensitizer. The ratio of photochemical sensitizer (0.1 g) to the radicalpolymerizable unsaturated group (10 g) remains the same.

Example of Experiment 3

The example of experiment 3 is the same as the example of experiment 1 except for using thioxanthone as the photochemical sensitizer. The ratio of photochemical sensitizer (0.1 g) to the radical-polymerizable unsaturated group (10 g) remains the same.

Example of Experiment 4

The example of experiment 4 is the same as the example of experiment 1 except for using naphthalene as the photochemical sensitizer. The ratio of photochemical sensitizer (0.1 g) to the radicalpolymerizable unsaturated group (10 g) remains the same.

Example of Experiment 5

The example of experiment 5 is the same as the example of experiment 1 except for using Benzil as the photochemical sensitizer. The ratio of photochemical sensitizer (0.1 g) to radical-polymerizable unsaturated group (10 g) remains the same.

Example of Experiment 6

The example of experiment 6 is the same as the example of experiment 1 except for using acridine as a photochemical sensitizer. The ratio of photochemical sensitizer (0.1 g) to radical-polymerizable unsaturated group (10 g) remains the same.

Example of Experiment 7

The example of experiment 7 is the same as example of experiment 1 except for not using a sensitizer.

The photocurable compositions described were subjected to a light exposure test as described below.

The compositions were coated on a polyester sheet and subjected to light-exposure test to measure the photocuring energy using a spectral sensitive meter after the composition was cured. The results obtained are shown in Table 2 below.

TABLE 2

| | COMPOSITION OF THE PRESENT INVENTION | |
|---|---|---|
| EXPERIMENT NUMBER | PHOTOCHEMICAL SENSITIZER USED | ENERGY FOR PHOTOCURING |
| 1 | N,N-Dimethylaniline | 62,956.6 erg/cm$^2$ |
| 2 | 2,2-dimethoxy-2-phenylacetophenone | 208,469.0 erg/cm$^2$ |
| 3 | thioxanthone | 13,1535.0 erg/cm$^2$ |
| 4 | napthalene | 263,566.0 erg/cm$^2$ |
| 5 | Benzil | 173.397.0 erg/cm$^2$ |
| 6 | acridine | not curing |
| 7 | none | 362,280.0 erg/cm$^2$ |

As it is seen from the results in Table 2, the photocurable composition of the invention (Experiment 1) is cured with less energy than the energy necessary for curing of the photocurable compositions which were used as the comparative examples. Further, the photocurable composition is cured in a short time compared with the photocurable compositions which were used as the comparative examples.

The invention is not limited to the above mentioned embodiment. It should be understood that many changes and modifications may be made in the embodiment without departing from the scope of the present invention. For instance, the photocurable composition can contain a spectral sensitizer.

Next, a second embodiment that attains the second object will now be described.

The radical-polymerizable unsaturated group-containing compounds in the present invention are not limited to specific kinds of materials. Examples of the radical-polymerizable unsaturated group-containing compounds which can be used as a base material in the invention are as for the first embodiment and include N-vinyl-2-pyrrolidone, bisphenol A diacrylate or dimethacrylate (hereafter, acrylate and methacrylate being collectively referred to as "(meth)acrylate"), tripropylene glycol di(meth)acrylate, polyethylene glycol di(meth)acrylate, pentaerythritol tri(meth)acrylate, dipentaerythritol hexa(meth) acrylate, trimethylolpropane tri(meth)acrylate and oligo ester (meth)acrylate. These compounds may be used alone or as a mixture. The photocurable composition of this embodiment uses the metal arene compound as the photopolymerization initiator.

The metal arene compound has a structure represented by formula (1).

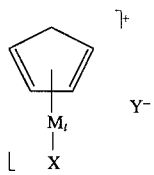

(1)

wherein $M_t$ is a metal such as Fe, with iron being the preferred metal. X is a group containing at least one benzene ring, for example, benzene itself is preferred. $Y^-$ is a basic ion such as $BF_4^-$, $PF_6^-$, and $AsF_6^-$.

The photocurable composition contains the metal arene compound in an amount of 0.01–20 weight % of the radical-polymerizable unsaturated group, preferred is the metal arene compound in an amount of 1–10 weight % of the radical-polymerizable unsaturated group. If the photocurable composition contains the metal arene compound in an amount of 20 weight % or more of the radical polymerizable unsaturated group, the metal arene compound does not dissolve in the radical-polymerizable unsaturated group. If the photocurable composition contains the metal arene compound in an amount of 0.01 weight % or less of the radical-polymerizable unsaturated group, the photocurable composition is not cured.

The photocurable compound comprises a cyanine system compound as the spectral sensitizer. The cyanine system compound has a structure represented by formula (8) and various types of the cyanine system compound are formed by changing conjugate chain length, heterocyclic and substituent components.

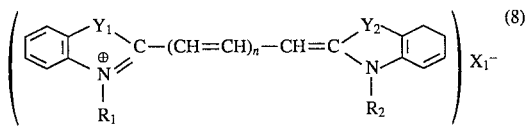

(8)

wherein $R_1$ and $R_2$ are alkyl groups which preferably have a carbon number 1–3. $Y_1$ and $Y_2$ stand for structures such as $CH-CH_3$, $N-CH_3$, $C(CH_3)_2$, $O$, $S$, and $Se$; $n$ is a positive integer; and $X_1$ is a counter ion.

The photocurable compound contains the cyanine system compound in an amount of 0.01–10 weight % for the radical-polymerizable unsaturated group, it is preferred the cyanine system compound be in an amount of 0.05–5 weight % for the radical-polymerizable unsaturated group. If the photocurable composition contains the cyanine system compound in an amount of 10 weight % or more for the radical-polymerizable unsaturated group, the photocurable composition is not cured. If the photocurable composition contains the cyanine system compound in an amount of 0.01 weight % or less for the radical-polymerizable unsaturated group, a spectral sensitization is not caused. In other words, the photocurable compound does not act upon irradiation of light having a wavelength which exists in an infrared region. That is, the spectral sensitizer has no effect on the photocurable composition.

According to the photocurable composition of the present invention, when the cyanine system compound is exposed to light, the cyanine system compound is excited as shown in scheme (9), and the excited photosensitizer makes the photopolymerization initiator radical through electron-transfer as shown in scheme (10).

The radical substance triggers addition polymerization of the compound having a radical-polymerizable unsaturated compound as shown in scheme (11).

(9)

(10)

(11)

In the above scheme
D: cyanine system compound
R: photopolymerization initiator
R·: radical generated from the photopolymerization initiator M: radical-polymerizable unsaturated group (monomer)

As is apparent from the description above, in the photocurable composition of the present invention, that is, the radical-polymerizable unsaturated group-containing compound, the photopolymerization initiator and the metal arene compound undergo the mentioned (9), (10), and (11) procedure, the photocurable composition can be designed to act upon irradiation of light having a wavelength from a visible light region to a near infrared region. Thus, a low-priced and compact sized semiconductor laser device can be used rather than a conventional high-price visible laser device to initiate the reaction. Hereinafter, the present invention will be described with reference to an embodiment.

Example of Experiment 8

N, N-dimethylaniline are used as an aniline system compound.

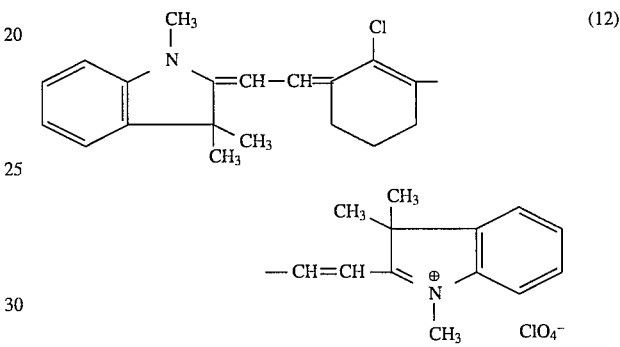

(12)

A photocurable composition comprises a radical-polymerizable unsaturated group including a mixed material which consists of polyethylene glycol di(meth)acrylate and dipentaerythritol hexa(meth) acrylate, as a base material, an iron arene compound as a photopolymerization initiator (X is benzene, Y is $PF_6^-$) and a cyanine system compound which is 3H-Indolium, 2-[2-[2-chloro-3-[(1,3-dihydro-1,3,3-trimethyl-2H-indol-2-ylidene)ethylidene]-1-cyclohexen-1-yl] ethenyl]-1,3,3-trimethyl-, perchlorate salt as shown by formula (12) as a spectral sensitizer in the mixing ratio described in Table 3 below.

TABLE 3

| RADICAL-POLYMERIZABLE UNSATURATED GROUP | AN AMOUNT OF THE MIXTURE |
|---|---|
| BASE MATERIAL | |
| Polyethylene glycol di(meth)acrylate<br>Dipentaerythritol hexa(meth)acrylate<br>(The ratio of mixture is 3:4) | 10 g |
| PHOTOPOLYMERIZATION INITIATOR | |
| Iron arene compound | 0.1 g |
| SPECTRAL SENSITIZER | |
| 2-[2-[ 2-chloro-3- [(1, 3-dihydro-1,3, 3-trimethyl-2H-indole-2-ylidene)ethylidene] -1- cyclohexane-1-yl] ethenyl] -1, 3, 3-trimethyl- 3H-indolium salt | 0.1 g |

The radical-polymerizable unsaturated group, the photopolymerization initiator and the sensitizer are mixed as described below.

First, to 10 g of a mixture of polyethylene glycol di(meth)acrylate and dipentaerythritol hexa(meth)acrylate (mixing ratio 3:4) were added 0.1 g of the iron arene compound as the photopolymerization initiator and 0.1 g of a mixture of 3H-Indolium, 2-[2-[2-chloro-3-[(1,3-dihydro-1,3,3-trimethyl-2H-indol-2-ylidene)ethylidene]-1-cyclohexen-1-yl] ethenyl]-1,3,3-trimethyl-, perchlorate salt (in above mentioned mixing ratio) as the spectral sensitizer. The mixture was then stirred at about 100° C. for about 15 minutes with supersonic irradiation while heating at a temperature of 20° (room temperature) to 200° C., preferably at 50° to 150° C. for at least 10 minutes of the 15 minutes.

Example of Experiment 9

The example of experiment 9 is the same as the example of experiment 8 except for using Eosin Y as the spectral sensitizer. The ratio of spectral sensitizer (0.1 g) to the radical-polymerizable unsaturated group (10 g) remains the same.

Example of Experiment 10

The example of experiment 10 is the same as the example of experiment 8 except for using Rhodamine B as the spectral sensitizer. The ratio of spectral sensitizer (0.1 g) to the radical-polymerizable unsaturated group (10 g) remains the same.

Example of Experiment 11

The example of experiment is all the same as the example of experiment 8 except for using methylene blue as the spectral sensitizer. The ratio of spectral sensitizer (0.1 g) to the radical-polymerizable unsaturated group (10 g) remains the same.

The results of a light-exposure test for the photocurable composition as shown below.

TABLE 4

| COMPOSITION OF THE PRESENT INVENTION | | |
| --- | --- | --- |
| EXPERIMENT NO. | WAVELENGTH OF LIGHT | ENERGY FOR PHOTOCURING |
| 8 | 780 nm | 77471.3 erg/cm$^2$ |
| 9 | 550 nm | 13445.0 erg/cm$^2$ |
| 10 | 550 nm | 39380.1 erg/cm$^2$ |
| 11 | 670 nm | 15165.2 erg/cm$^2$ |

The above prepared compositions of Table 4 were coated on polyester sheet and subjected to a light-exposure test to measure the energy for photocuring of the composition when the composition is cured.

In example of experiment 8 (the invention), when the photocurable composition of the present invention is irradiated by light having a wavelength of 780 nm, which exists the near of the infrared region, 77471.3 erg/cm$^3$ is needed to cure the photocurable composition. Similarly, in example of experiment 9, when the comparative photocurable composition is irradiated by light having a wavelength of 570 nm, 13445.0 erg/cm$^2$ is needed to cure the photocurable composition. The samples of experiment 9, 10 and 11, when irradiated by light having a wavelength of 780 nm, which exists the near of the infrared region, were not cured.

As can be seen from the results in the Table 4 above, the photocurable composition of the present invention can act upon irradiation light having a wavelength from the visible light region to the near infrared region and the comparative photocurable compositions only act upon irradiation of visible light.

The invention is not limited to the above mentioned embodiment. It should be understood that many changes and modifications may be made in the embodiment without departing from the scope of the present invention.

For example, in order to attain simultaneously both the first and second objects of the invention, a photocurable composition comprising a radical-polymerizable unsaturated group including a mixed material which consists of polyethylene glycol di(meth)acrylate and dipentaerythritol hexa(meth)acrylate as a base material, an iron arene compound as a photopolymerization initiator, the aniline system compound which is N,N-Dimethylaniline as a photochemical sensitizer and the cyanine system compound which is 3H-Indolium, 2-[2-[2-chloro-3-[(1,3-dihydro-1,3,3-trimethyl-2H-indol-2-ylidene)ethylidene]-1-cyclohexen-1-yl] ethenyl]-1,3,3-trimethyl-, perchlorate salt as a spectral sensitizer may be used.

In this case, a mixing ratio is shown in Table 5 below is used.

TABLE 5

| RADICAL POLYMERIZABLE UNSATURATED GROUP | AN AMOUNT OF THE MIXTURE |
| --- | --- |
| BASE MATERIAL | |
| Polyethylene glycol di(meth)acrylate Dipentaerythritol hexa(meth)acrylate (The ratio of mixture is 3:4) | 10 g |
| PHOTOPOLYMERIZATION INITIATOR | |
| Iron arene compound | 0.1 g |
| PHOTOCHEMICAL SENSITIZER | |
| N, N-Dimethylaniline | 0.1 g |
| SPECTRAL SENSITIZER | 0.1 g |
| 3H-Indolium, 2-[2-[2-chloro-3-[(1,3-dihydro-1,3,3-trimethyl-2H-indol-2-ylidene)ethylidene]-1-cylcohexane-1-yl]ethenyl]-1,3,3-trimethyl perchlorate salt | |

What is claimed is:

1. A photocurable composition having improved photocuring sensitivity to light of a wavelength ranging from ultraviolet to infrared, consisting essentially of:

(i) a compound having a radical-polymerizable unsaturated group;

(ii) an iron arene compound photopolymerization initiator; and (iii) an aniline compound as a photochemical sensitizer.

2. The photocurable composition as claimed in claim 1, wherein said iron arene compound is contained in an amount of 0.01–20 weight % of said radical-polymerizable unsaturated group and said aniline compound is in a range of 0.01–50 weight % of said radical-polymerizable unsaturated group.

3. The photocurable composition as claimed in claim 1, wherein the iron arene compound has the formula

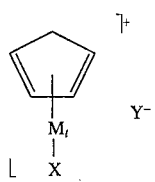

wherein $M_t$ is a iron, X is a group containing at least one benzene ring, and $Y^-$ is a basic ion selected from $BF_4^-$, $PF_6^-$, or $AsF_6^-$.

4. The photocurable composition as claimed in claim 3, wherein $M_t$ is iron, X is benzene and $Y^-$ is $PF_6^-$.

5. The photocurable composition as claimed in claim 1, wherein said aniline compound comprises at least one member selected from the group consisting of N,N-dimethylaniline; 4-cyano-N,N-dimethylaniline; 4-acetyl-N,N-dimethylaniline; 4-bromo-N,N-dimethylaniline; ethyl 4-(N,N-dimethylamino)benzoate; 3-chloro-N,N-dimethylaniline; 4-chloro-N,N-dimethylaniline; 3-ethoxy-N,N-dimethylaniline; 4-fluoro-N,N-dimethylaniline; 4-methyl-N,N-dimethylaniline; 4-ethoxy-N,N-dimethylaniline; N,N-dimethylthioanisidine; 4-amino-N,N-dimethylaniline; 3-hydroxy-N,N-dimethylaniline; N,N,N',N'-tetraethyl-1,4-dianiline; and 4-acetamide-N,N-dimethylaniline.

6. A photocurable composition sensitive to light having a wavelength ranging from visible to near infrared, comprising:

(i) a compound having a radical-polymerizable unsaturated group;

(ii) a iron arene compound as a photopolymerization initiator; and (iii) a cyanine compound as a spectral sensitizer, wherein said cyanine compound has the formula:

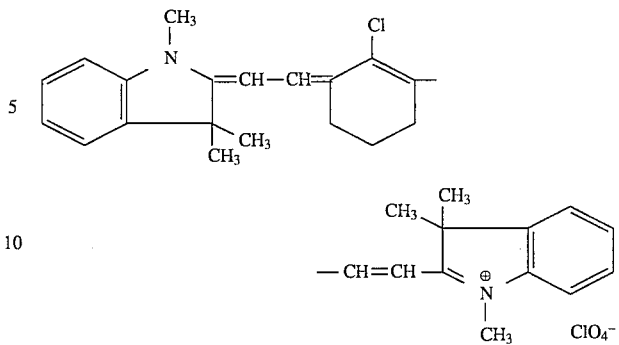

7. The photocurable composition as in claim 6, wherein said iron arene compound is contained in an amount of 0.01–20 weight % of said radical-polymerizable unsaturated group and said cyanine compound is contained in an amount of 0.01–10 weight % of said radical-polymerizable unsaturated group.

8. The photocurable composition as claimed in claim 6, wherein the iron arene compound has the formula

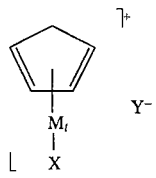

wherein $M_t$ is a iron X is a group containing at least one benzene ring, and $Y^-$ is a basic ion selected from $BF_4-$, $PF_6-$, or $AsF_6^-$.

9. The photocurable composition as claimed in claim 8, wherein $M_t$ is iron, X is benzene, and $Y^-$ is $PF_6^-$.

10. The photocurable composition as claimed in claim 6, wherein said photocurable composition is sensitive to infrared light.

* * * * *